United States Patent [19]
Yoshizawa

[11] Patent Number: 6,163,288
[45] Date of Patent: Dec. 19, 2000

[54] DIGITAL-TO-ANALOG CONVERTER IN WHICH AN ANALOG OUTPUT OF LOW ORDER BITS IS ATTENUATED, AND ADDED TO AN ANALOG OUTPUT OF HIGH ORDER BITS

[75] Inventor: Akihiko Yoshizawa, Yokohama, Japan

[73] Assignee: Kabushiki Kaisha Toshiba, Kawasaki, Japan

[21] Appl. No.: 09/168,381

[22] Filed: Oct. 8, 1998

[30] Foreign Application Priority Data

Oct. 9, 1997 [JP] Japan ................................. 9-277389

[51] Int. Cl.⁷ ..................................................... H03M 1/66
[52] U.S. Cl. ............................................. 341/144; 341/154
[58] Field of Search .................................... 341/144, 154, 341/156, 155, 145, 159

[56] References Cited

U.S. PATENT DOCUMENTS 4,973,979  11/1990  Ikeda ........................................ 341/154
5,534,863   7/1996  Everitt et al. ............................ 341/144

FOREIGN PATENT DOCUMENTS 4-94220    3/1992  Japan .
6-268523   9/1994  Japan .

*Primary Examiner*—Michael Tokar
*Assistant Examiner*—Jean B. Jeanglaude
*Attorney, Agent, or Firm*—Oblon, Spivak, McClelland, Maier & Neustadt, P.C.

[57] ABSTRACT

A digital-to-analog converter has a first digital-to-analog converter for M bits, for receiving M high order bits of input data of N bits, and then outputting a predetermined analog output, and a second digital-to-analog converter for (N-M) bits, for receiving (N-M) low order bits of the input data, and then outputting a predetermined analog output. An attenuator attenuates the analog output of the second digital-to-analog converter to $1/2^M$. An analog operating circuit adds the analog output of the first digital-to-analog converter and the attenuated analog output of the second digital-to-analog converter, and outputs an analog output as a result of addition of those analog outputs.

20 Claims, 4 Drawing Sheets

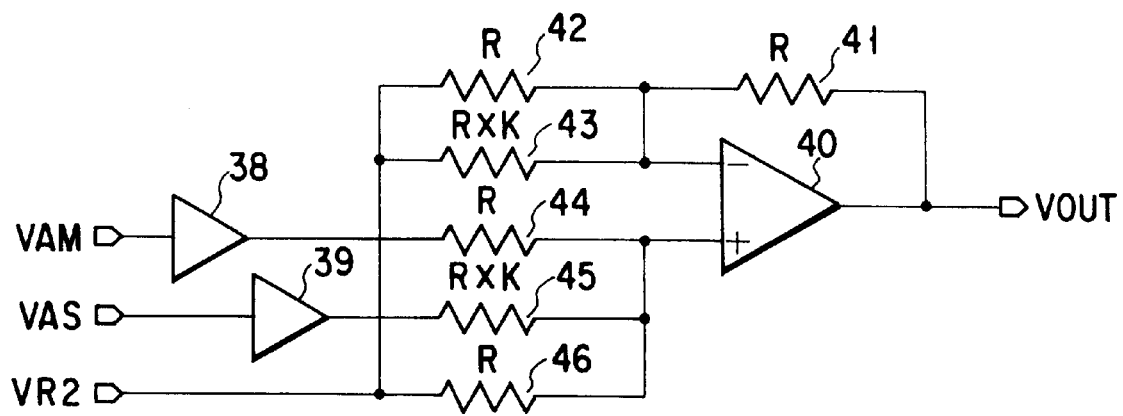
F I G. 2
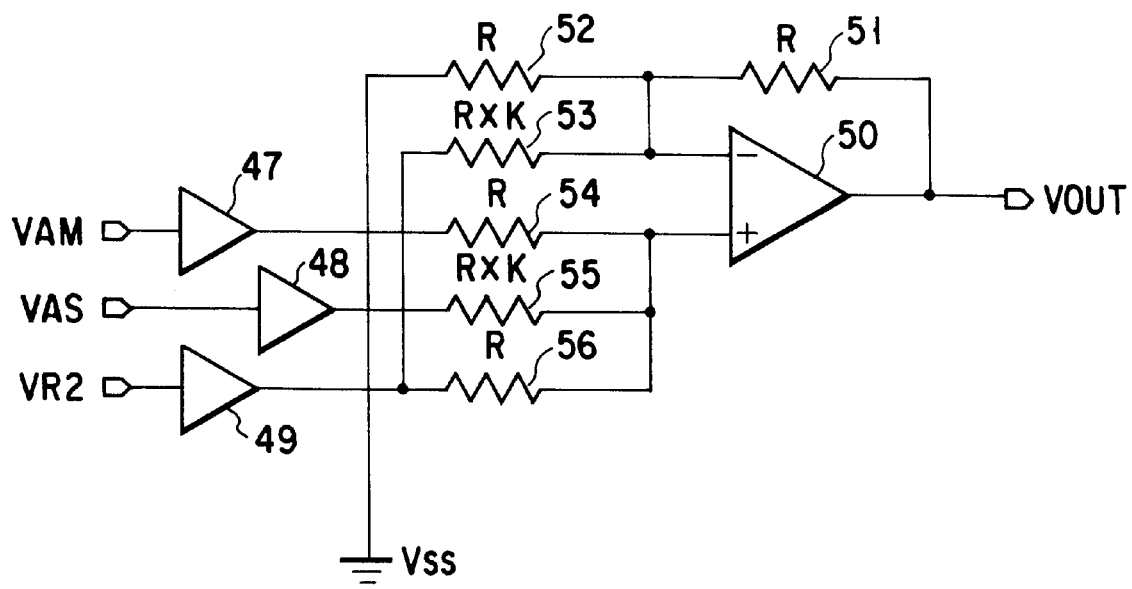
F I G. 3

DIGITAL-TO-ANALOG CONVERTER IN WHICH AN ANALOG OUTPUT OF LOW ORDER BITS IS ATTENUATED, AND ADDED TO AN ANALOG OUTPUT OF HIGH ORDER BITS

BACKGROUND OF THE INVENTION

The present invention relates to a digital-to-analog converter.

FIG. 6 is a view showing the structure of a conventional digital-to-analog converter. The converter divides input digital data of N bits into M high order bits and (N-M) low order bits. The M high order bits are input to a digital-to-analog converter 12 for high order bits, and the (N-M) low order bits are input to a digital-to-analog converter 20 for low order bits. The digital-to-analog converter 12 for high order bits comprises: a string of $2^M$ resistors 3 to 8 (resistor string) for high order bits, which are unit resistors Rm series-connected to each other between a first reference voltage VR1 (10) and a second reference voltage VR2 (11); $2^M$ switch circuits 2 each of which is designed to select one of divided voltages which are obtained by dividing the voltage between the first reference voltage VR1 (10) and the second reference voltage VR2 (11) by means of a respective one of the $2^M$ resistors 3 to 8; and a decoder 1 for outputting a selection signal for selecting one of the $2^M$ switches 2 which corresponds to the input M-bit digital data. A resistor element Rc 9 is a resistor element for adjustment.

The digital-to-analog converter 20 for low order bits comprises: a string of $2^{(N-M)}$ resistors 15 to 19 for low order bits which are unit resistors Rs connected in parallel with both the ends of the unit resistor Rm (8), and which are series-connected to each other; $2^{(N-M)}$ switch circuits 14 each of which is designed to select one of divided voltages which are obtained by dividing the voltage between the first reference voltage VR1 (10) and the second reference voltage VR2 (11) by means of a respective one of the $2^{(N-M)}$ resistors 15 to 19; and a decoder 13 for outputting a selection signal for selecting one of the $2^{(N-M)}$ switches 14 which corresponds to the input (N-M)-bit digital data.

In the conventional digital-to-analog converter having the above structure, the digital-to-analog converter 12 outputs an analog output having an M-bit resolution, and the digital-to-analog converter 20 outputs an analog output having an (N-M)-bit resolution.

Those analog outputs are added by an analog adder 21, thereby obtaining an analog output having an N-bit resolution between the first reference voltage VR1 (10) and the second reference voltage VR2 (11).

By virtue of the above structure, in order to obtain an analog output having an N-bit resolution, the number of unit resistors and that of switch circuits can be reduced greatly, as compared with the case where an analog output having an N-bit resolution is obtained with one digital-to-analog converter. Accordingly, the above conventional digital-to-analog converter can be easily incorporated into a chip and manufactured at a low cost.

More specifically, in order to obtain an analog output having a 12-bit resolution, for example, the above conventional digital-to-analog converter differs from a circuit using only one digital-to-analog converter as follows:

The circuit using only one digital-to-analog converter needs 4096 ($2^{12}$) unit resistors and 4096 switch circuits respectively associated with the unit resistors. On the other hand, the aforementioned conventional digital-to-analog converter has only 128 ($2^6 \times 2$) unit resistors (64 units resistors for high order bits plus 64 units resistors for low order bit) plus 128 switch circuits respectively associated with the unit resistors, if the input data is divided into 6 high order bits and 6 low order bits.

In such a manner, when the input data is divided into two, i.e., high order bits and low order bits, or three, the number of structural elements provided in the circuit is far smaller than that of structural elements of the circuit having one digital-to-analog converter. However, the above conventional digital-to-analog converter has the following disadvantages:

First, the analog output of the conventional digital-to-analog converter has bad linearity.

The linearity of the analog output is important for a resistor string type of digital-to-analog converter (which uses a string of resistors). It is influenced by the variance in resistance value among the unit resistors if the circuit has only digital-to-analog converter. In contrast, the conventional digital-to-analog converter which divides the input data into two further error factors worsening the linearity function, in addition to the variance in resistance value among the unit resistors. To be more specific, one of the unit resistors Rm for high order bits, which is connected in parallel with the resistor string for low order bits, is lower in resistance value than each of the other unit resistors Rm for high order bits. Due to this, the resistor Rc for adjustment is connected in series to said one of the unit resistors Rm. Its resistance needs to be adjusted such that the total resistance of said one of the unit resistors Rm, the resistor Rc for adjustment and the resistor string for low order bits is equal to the resistance of each of the other unit resistors Rm for high order bits.

Furthermore, in the conventional digital-to-analog converter, the linearity is greatly influenced by the resistances of the resistor Rc for adjustment and the resistor Rm connected in parallel with the resistor string for low order bits. This will be explained in detail as follows:

FIGS. 5A and 5B show conversion characteristics of the conventional digital-to-analog converter.

As shown in FIG. 5A, ideal digital-to-analog conversion characteristics represented by a line 62 in FIG. 5A cannot be obtained, and an error voltage Verror is generated at the turn from conversion of high order bits to conversion of low order bits, as shown in a two-dot chain line 63, when the total resistance of the resistor Rc and the unit resistor Rm for high order bits connected in parallel with the resistor string for low order bits is smaller than each of the other resistors Rm for high order bits.

Also, when the above total resistance is greater than each of the other resistors Rm for high order bits, ideal digital-to-analog conversion characteristics represented by a line 65 cannot be obtained, and an error voltage Verror represented by a two-dot chain line 64 is generated, thus losing the linearity.

Such a disadvantage gives rise to a problem in the case where the digital-to-analog converter is incorporated into an LSI chip or the like. In the case of doing so, in order resistors be formed to have the same resistance, they are formed to have the same shape, although they are formed in different manufacturing processes. As a result, their relative resistance values do not vary, even if their absolute resistance values vary. However, in the conventional digital-to-analog converter, it is difficult to reduce the variance in relative resistance values among the unit resistors Rm, since the resistor Rc for adjustment is needed for the unit resistor Rm for high order bits connected in parallel with the resistor string for low order bits.

In such a manner, in the conventional digital-to-analog converter, the variance in relative resistance value is hard to reduce. Thus, the converter cannot maintain the linearity of the analog output, although the number of the unit resistors and that of the switch circuits can be reduced greatly.

Furthermore, in order for digital-to-analog conversion to be performed with a high precision, the conventional digital-to-analog converter requires adjustment by trimming or the like after it is manufactured, which is troublesome.

In addition, the operating speed of a resistor string type of digital to analog converter depends on the output impedance of the resistor string. Thus, the operating speed of the conventional digital to analog converter of a resistor string type is limited due to the output impedance of the resistor string for low order bits, since the output impedance of the resistor string for low order bits is higher than that of the resistor string for high order bits. The output impedance of the resistor string for low order bits cannot be easily decreased from the standpoint of structure. In this point, the conventional digital-to-analog converter cannot be designed to operate at a higher speed.

BRIEF SUMMARY OF THE INVENTION

In view of the forgoing, the first object of the present invention is to provide a digital-to-analog converter which outputs an analog output having a good linearity, by attenuating an analog output obtained from low order bits, and then adding the analog output to an analog output obtained from high order bits.

The second object of the present invention is to provide a digital-to-analog converter having a resistor string used commonly by digital-to-analog converters for high order bits and for low order bits, and thus is formed to have a small size and manufactured at a low cost.

The third object of the present invention is to provide a digital-to-analog converter in which a resistor string is used in common by digital-to-analog converters for high order bits and low order bits, and the output impedance of the resistor string can be easily decreased, thus increasing the operating speed of the digital-to-analog converter.

In order to attain the above objects, a digital-to-analog converter of the first aspect comprises:

a first digital-to-analog converter for M bits, for receiving M high order bits of input data of N bits, and then outputting an analog output;

a second digital-to-analog converter for (N-M) bits, for receiving (N-M) low order bits of the input data of N bits, and then outputting an analog output; and an analog operating circuit for adding the analog outputs of the first and second digital-to-analog converters, with the ratio of the former to the latter being substantially $2^M:1$, and outputting an analog signal representing a result of addition of the analog outputs.

In the digital-to-analog converter of the second aspect, according to the first aspect, at least one of the first and second digital-to-analog converters comprises:

a decoder for decoding input digital data;

a voltage dividing circuit comprising unit resistors, which are series-connected to each other between a first reference voltage and a second reference voltage, for outputting divided voltages having a resolution determined in accordance with the number of the N bits of the input data; and switch circuits connected to voltage dividing output terminals of the voltage dividing circuits, respectively, each of the switch circuits being designed to select one of the divided voltages output from the voltage dividing circuit in accordance with output data of the decoder.

In the digital-to-analog converter of the third aspect, according to the first aspect, the voltage dividing circuit is used in common by the first and second digital-to-analog converters.

In the digital-to-analog converter of the fourth aspect, according to the fourth aspect, the analog operating circuit comprises a plurality of resistor elements for determining the ratio of $2^M$ to 1 and an operational amplifier for addition of analog outputs.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 2 is a view showing the first example of integral construction of an attenuator and an analog adder;

FIG. 3 is a view showing the second example of integral construction of an attenuator and an analog adder;

DETAILED DESCRIPTION OF THE INVENTION

Figure 1:
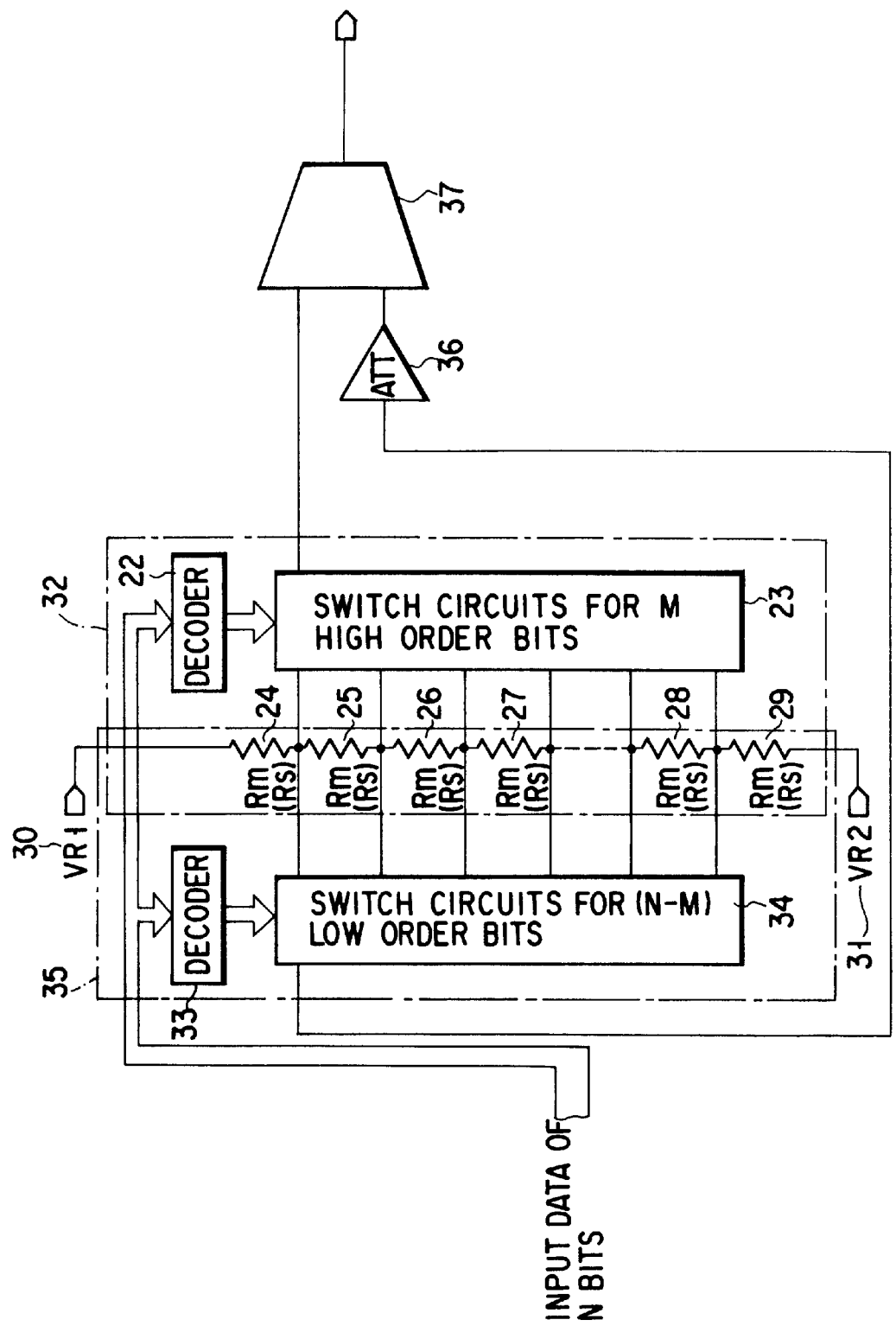
FIG. 1 is a view showing the structure of a digital-to-analog converter according to an embodiment of the present invention.

An embodiment of the present invention will be explained in detail with reference to the accompanying drawings as follows:

FIG. 1 is a circuit diagram showing the structure of a digital-to-analog converter according to the embodiment of the present invention. In the digital-to-analog converter, input digital data of an n-number of bits is divided into M high order bits and (N-M) low order bits, and the M high order bits are input to a digital-to-analog converter 32 for high order bits, and the (N-M) low order bits are input to a digital-to-analog converter 35 for low order bits.

The digital-to-analog converter 32 for high order bits comprises: a string of $2^M$ resistors 24 to 29 (resistor string) for high order bits, which are unit resistors Rm series-connected to each other between a first reference voltage VR1 (30) and a second reference voltage VR2 (31), constituting a voltage divider; $2^M$ switch circuits 23 each of which is designed to select one of divided voltages which are obtained by dividing the voltage between the first reference voltage VR1 (30) and the second reference voltage VR2 (31) by means of a respective one of the $2^M$ resistors 24 to 29; and a decoder 22 for outputting a selection signal for selecting one of the $2^M$ switch circuits 23 which corresponds to the number of the input M bits.

The digital-to-analog converter 35 for the low order bits comprises: a string of $2^{(N-M)}$ of resistors 24 to 29 (resistor string) for low order bits, which are unit resistors Rs series-connected to each other between the first reference voltage VR1 (30) and the second reference voltage VR2 (31), constituting a voltage divider; $2^{(N-M)}$ switch circuits 34 each of which is designed to select one of divided voltages which are obtained by dividing the voltage between the first reference voltage VR1 (30) and the second reference voltage VR2 (31) by means of a respective one of the $2^{(N-M)}$ resistors 24 to 29; and a decoder 33 for outputting a selection signal for selecting one of the $2^{(N-M)}$ switch circuits 34 which corresponds to the number of the input (N-M) bits.

The digital-to-analog converter 32 outputs an analog output having a M-bit resolution as an analog output for high order bits, and the digital-to-analog converter 35 outputs an analog output having an (M-N)-bit resolution as an analog output for low order bits. An analog adder 37 adds the analog output for high order bit and an analog output which is substantially $1/2^M$ of the analog output for high order bits and which is obtained by attenuating the analog output for low order bits by means of an attenuator 36, thereby obtaining an analog output having an N-bit resolution.

In the embodiment, the resistors 24 to 29 (resistor string) are used in common for high order bits and low order bits, and divided between the reference voltages VR1 (30) and VR2 (31) in accordance with the number of bits of input data. In other words, the resistor string doubles as the resistor string for high order bits and the resistor string for low order bits, since the difference between the resistor string used for high order bits and for low order bits resides only in the number of resistors for dividing a voltage, in the case where the number of high order bits differs from the number of low order bits.

By virtue of the above feature, the number of resistors can be decreased by either the resistor string for high order bits (the M high order bits) or the resistor string for low order bits (the (N-M) low order bits) can be deleted, whichever is smaller than the other in the number of resistors. As a result, the size of the digital-to-analog converter is small, and the cost thereof is low.

For example, the difference between the digital-to-analog converter according to the embodiment and the conventional digital-to-analog converter will be explained by referring to the case of obtaining an analog output having a 12-bit resolution.

If input digital data is divided into 6 high order bits and 6 low order bits, the conventional digital-to-analog converter comprises 128 ($2^6=64\times2$) unit resistors (64 unit resistors for high order bits and 64 unit resistors for low order bits) and 128 switch circuits, whereas the digital-to-analog converter according to the embodiment comprises 64 switch circuits and 64 ($2^6$) unit resistors the number of which is half that of the unit resistors of the conventional digital-to-analog converter. If the input digital data is divided into 7 high order bits and 5 low order bits, the digital-to-analog converter according to the embodiment has unit resistors the number of which is less than that of the unit resistors of the conventional digital-to-analog converter by $2^5$ (32).

In this case, for high order bits, all the switch circuits for high order bits which are respectively associated with the unit resistors Rm are connected to each other, whereas for low order bits, those of the switch circuits for low order bits which are respectively associated with every four unit resistors Rm are connected to each other. In other words, the number of the unit resistors Rs for low order bits is 1/4 of the number of the unit resistors Rm for high order bits (Rs=Rm×4).

Furthermore, in the embodiment, the resistors 24 to 29 double as the resistors for high order bits and the resistors for low order bits. Thus, the operating speed of the digital-to-analog converter is limited due to the output impedance of the resistors 24 to 29 doubling as the resistors for high order bits and low order bits.

However, the output impedance can be easily decreased, and thus the operating speed can be easily increased.

FIG. 2 is a view of the first example of the integral construction of the analog adder 37 and the attenuator 36 as an analog operating circuit. The attenuator 36 is used for attenuating the analog output of the digital-to-analog converter 35 for low order bits to $1/2^M$. This circuit, as shown in FIG. 2, comprises: first and second voltage follower amplifiers 38 and 39 for receiving the analog outputs of the digital-to-analog converter 32 for high order bits and digital-to-analog converter 35 for low order bits; an operational amplifier 40 for addition of analog outputs; a first resistor element 41 for feedback, which connects the output terminal and negative input terminal of the operational amplifier 40; second and third resistor elements 42 and 43 connected in parallel with each other between the second reference voltage VR2 (31) and the negative input terminal of the operational amplifier 40; a fourth resistor element 44 connected between the positive input terminal of the operational amplifier 40 and the output terminal of the first voltage follower amplifier 38; a fifth resistor element 45 connected between the positive input terminal of the operational amplifier 40 and the output terminal of the second voltage follower amplifier 39; and a sixth resistor element 46 connected between the positive input terminal of the operational amplifier 40 and the second reference voltage VR2 (31). The second, fourth and sixth resistor elements 42, 44 and 46 have the same resistance value, and the third and fifth resistor elements 43 and 45 have the same resistance value. The resistance value of the second, fourth and sixth resistor elements 42, 44 and 46 and the resistance value of the third and fifth resistor elements are determined to satisfy a resistance ratio in accordance with the number of the M high order bits. In addition, "K" in FIG. 2 denotes an attenuating ratio, and the attenuating ratio K is $2^M$.

The above circuit of the integral construction is an analog operating circuit for adding the analog output of the digital-to-analog converter 32 and the analog output of the digital-to-analog converter 35, with the ratio of the former to the latter being $2^M:1$, and then outputting an analog signal representing a result of addition of the above analog outputs.

The analog output VOUT of the digital-to-analog converter is expressed by the following equation:

$$VOUT = VR2 + VAM - VR2 + (VAS - VR2)/K$$
$$= VAM + (VAS - VR2)/K$$

where VAM is an analog output voltage of the digital-to-analog converter 32 for high order bits, and VAS is an analog output voltage of the digital-to-analog converter 35 for low order bits.

The analog operating circuit which receives the analog outputs VAM and VAS has voltage follower amplifiers 38 and 39 as a buffer, since its input impedance is low. In addition, it needs a voltage follower amplifier as an output buffer if a load having a low impedance is connected to the analog output VOUT. The analog output VOUT having an N-bit resolution is obtained in accordance with the above equation.

In the embodiment, the attenuating ratio of high order bits to low order bits is determined in accordance with the resistance ratio of a resistance R to a resistance R×K. Therefore, a digital-to-analog converter can be achieved which outputs an analog output having a good linearity, since the relative ratio of the resistance R to the resistance R×K is kept at a high precision.

Therefore, the digital-to-analog converter according to the embodiment can output an analog output having an excellent linearity, without the need to provide a resistor Rc for adjustment or to carry out a considerably complicated processing such as trimming after the converter is manufactured, unlike the conventional digital-to-analog converter.

FIG. 3 is the second example of the integral construction of the analog adder 37 and the attenuator 36 for attenuating the analog output of the digital-to-analog converter 35 for low order bits to $1/2^M$ of the analog output. This circuit, as shown in FIG. 3, comprises: first and second voltage follower amplifiers 47 and 48 for receiving the analog outputs of the digital-to-analog converter 32 for high order bits and the digital-to-analog converter 35 for low order bits; a third voltage follower amplifier 49 for receiving the second reference voltage VR2 (31); an operational amplifier 50 for addition of analog outputs; a first resistor element 51 for feedback, which connects an output terminal of the operational amplifier 50 to a negative input terminal thereof; a second resistor element 52 connected between the negative input terminal of the operating terminal 50 and ground potential VSS; a third resistor element 53 connected between the negative input terminal of the operational amplifier 50 and the output terminal of the third voltage follower amplifier 49; a fourth resistor element 54 connected between a positive input terminal of the operational amplifier 50 and an output terminal of the first voltage follower amplifier 47; a fifth resistor element 55 connected between the positive input terminal of the operational amplifier 50 and the output terminal of the second voltage follower amplifier 48; and a sixth resistor element 56 connected between the positive input terminal of the operational amplifier 50 and an output terminal of the third voltage follower amplifier 49. The second, fourth and sixth resistor elements 52, 54 and 56 have the same resistance, and the third and fifth resistor elements 53 and 55 have the same resistance. The resistance of the second, fourth and sixth resistor elements 52, 54 and 56 and the resistance of the third and fifth resistor elements 53 and 55 are determined to satisfy a resistance ratio in accordance with the number of the M high order bits.

The second resistor element 52 may be connected between the negative input terminal of the operational amplifier 50 and the second reference voltage VR2 (31), instead of between the negative input terminal of the operational amplifier 50 and the ground potential VSS.

Figure 4:
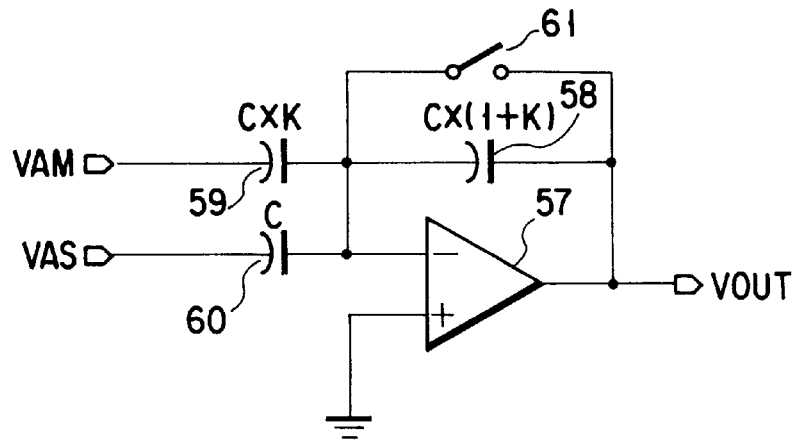
FIG. 4 is a view showing the third example of integral construction of an attenuator and an analog adder.
Figure 5A:
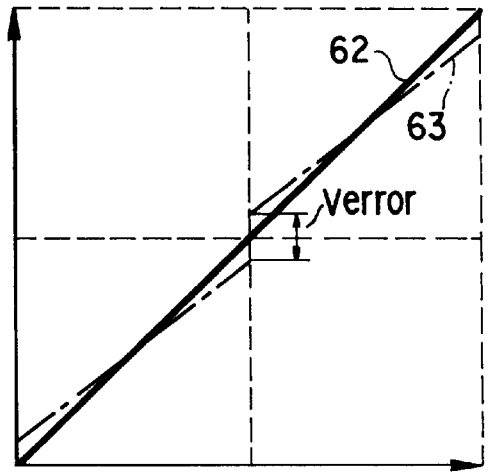
FIGS. 5A and 5B are views each showing conversion characteristics of a conventional digital-to-analog converter, and generation of an error voltage at the turn from conversion of high order bits to conversion of low order bits.
Figure 5B:
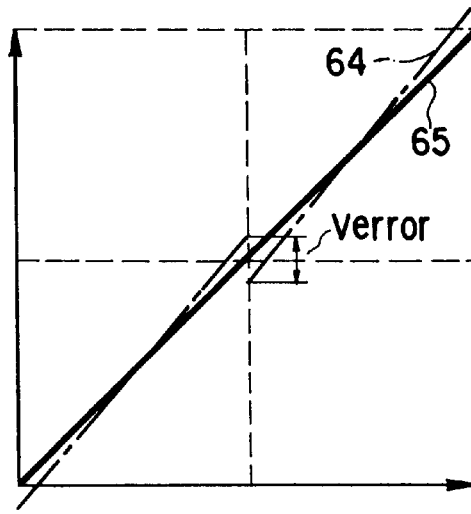
Figure 6:
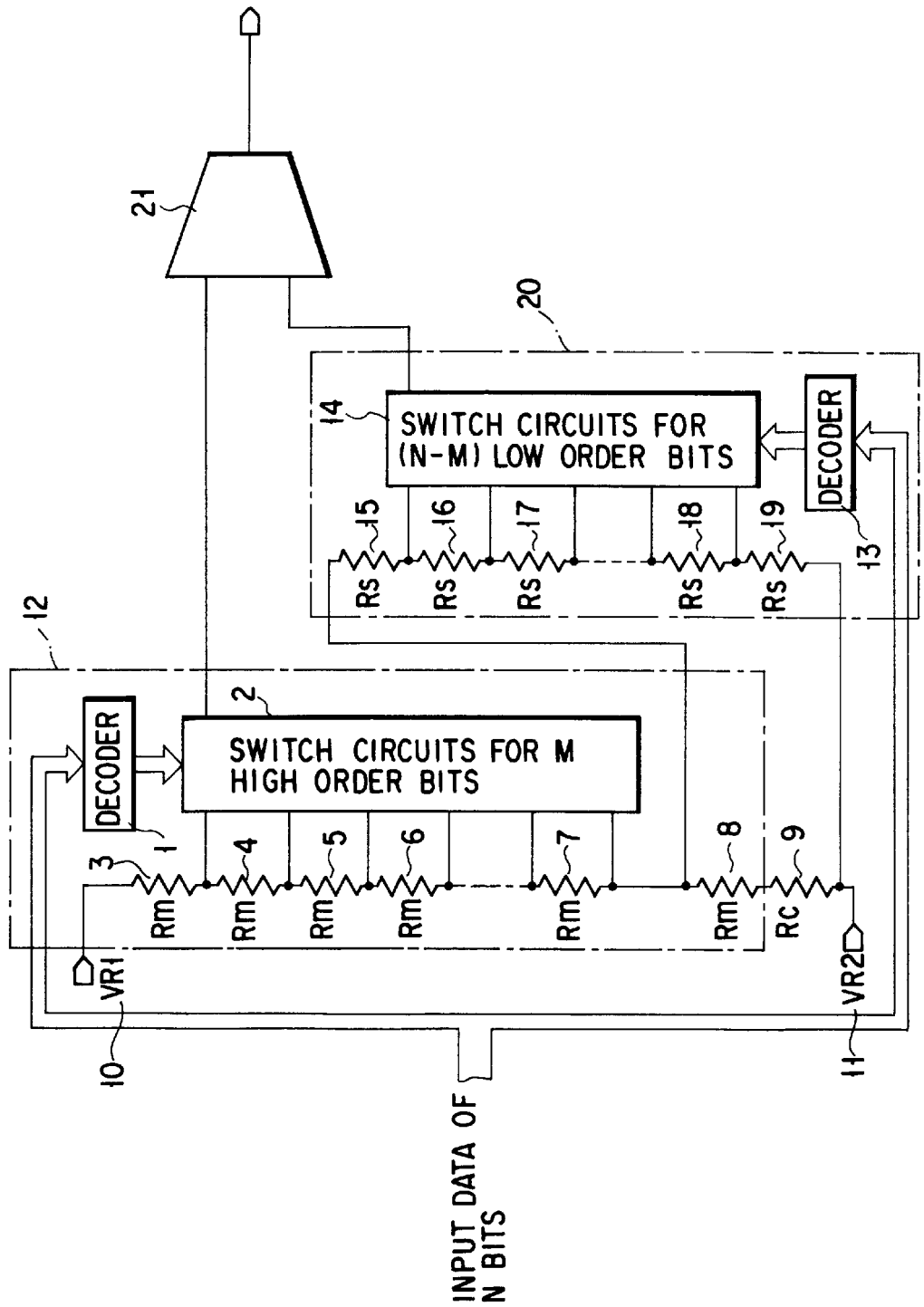
FIG. 6 is a view showing the structure of the conventional digital-to-analog converter.

The "K" in FIG. 4 denotes an attenuating ratio, and the attenuating ratio K is $2^M$ as in the first example.

The analog output VOUT of the digital-to-analog converter having the above construction is expressed by the following equation:

$$VOUT = VR2 + VAM - VSS + (VAS - VR2)/K.$$

In the second example, the voltage follower amplifier 49 as a buffer is provided for the second reference voltage VR2 (31), and the resistor R (the resistor element 52) for inputting, connected to the negative input terminal of the operational amplifier 50 for addition of analog outputs, is connected to the ground potential VSS. In this regard, the second example differs from the first example.

More specifically, the input impedance of the operational amplifier 50 is low when the second reference voltage VR2 (31) is set at an intermediate potential of the resistors between power source VDD and the ground potential VSS. Therefore, the voltage follower amplifier 49 is provided for the second reference voltage VR2 (31).

Furthermore, with respect to the term "(VAS−VR2)/K" of the above equation, if an output offset occurs at the voltage follower amplifier as a buffer, the offset voltages of the VAS and VR2 cancel each other, thus further improving the linearity of the analog output, as compared with the first example.

Next, the following is the reason that the resistor R (the resistor element 52) for inputting, connected to the negative input terminal of the operational amplifier 50, is connected to the ground potential VSS:

Due to this connection, an offset voltage corresponding to the voltage VR2 can be added to the analog output VOUT. This is based on the above equation. To be more specific, the above connection enables the range of the analog output of the digital-to-analog converter to differ from the range of the analog output of the resistor string. For example, when the analog output of the resistor string falls within 0.75V to 2.75V (2Vp–p:1.75 center), VR2 is 0.75V, and it is determined from the equation that the analog output of the digital-to-analog converter falls within 1.5V to 3.5V (2Vp–p:2.5V center).

By virtue of this feature, if the voltage follower amplifiers as a buffer and the switch circuits have optimal operating ranges with respect to analog characteristics, the analog output of the resistor string can be determined in accordance with the above optimal operating ranges, and the analog output of the digital-to-analog converter can be determined to fall within the range specified in the specification of the digital-to-analog converter. As a result, the linearity of the analog output of the digital-to-analog converter can be improved since the voltage follower amplifiers as a buffer and the switch circuits can be used within the optimal operating ranges with respect to the analog characteristics.

Furthermore, if the resistor R for feedback, which connects the output terminal and negative input terminal of the amplifier for addition of analog outputs, is set at a value G times greater than the resistor R for inputting, the digital-to-analog converter can have a gain G times greater than that in the case where the resistor R for feedback is set at the same value as the resistor R for inputting. For example, when the resistor R for feedback is set a value 1.5 times greater than the resistor R for inputting, and the analog output amplitude of the resistor string is 2Vp–p, the analog output amplitude of the digital-to-analog converter is 3Vp–p.

FIG. 4 shows the third example of the integral construction of the analog adder 37 and the attenuator 36 for attenuating the analog output of the digital-to-analog converter 35 for low order bits to $1/2^M$ of the analog output. This circuit, as shown in FIG. 4, comprises (i) an operational amplifier 57 for addition of analog outputs, (ii) a first capacitor element 58 for feedback, which connects an output terminal of the operational amplifier 57 and a negative input terminal thereof, (iii) a switch element 61 connected in parallel with the first capacitor element 58, (iv) a second capacitor element 59 connected between the negative input terminal of the operational amplifier 57 and an analog output terminal of the digital-to-analog converter 32 for high order bits, and (v) a third capacitor element 60 connected between the negative input terminal of the operational amplifier 57 and the analog output terminal of the digital-to-analog converter 35 for low order bits. A positive input terminal of the operational amplifier 57 is connected to the ground potential VSS, the capacitance of the second capacitor element 59 and the capacitance of the third capacitor element 60 are determined such that a capacitance ratio of the former capacitance to the latter capacitance varies in accordance with the number of the M bits.

The circuit of the third example adds the capacitances of the capacitor elements, whereas each of the circuits of the first and second examples adds the resistances of the resistor elements. The "K" in FIG. 4 denotes an attenuating ratio, and the attenuating ratio K is $2^M$.

In the circuit of the third example having the above feature, the analog output VOUT of the digital-to-analog converter is expressed by the following equation:

$$VOUT=(VAM \times K + VAS)/(1+K).$$

In this case, the input impedance of the operational amplifier 57 is high, and thus the circuit of the third example does not use the voltage follower amplifiers as a buffer which are necessary for the circuits of the first and second examples which add the resistances of the resistor elements. Furthermore, if the capacitance C×(1+K) of the first capacitor element 58 for feedback, which connects the output terminal and negative input terminal of the operational amplifier 57, is set at a value G times greater than the capacitance C×K of the second capacitor element 59, the operational amplifier 57 can have a gain 1/G times greater than that in the case where the capacitance C×(1+K) of the first capacitor element 58 is set at the same value as the capacitance C×K of the second capacitor element 59.

As explained above, in the embodiment, a weighting value is added to one of the analog outputs of the digital-to-analog converters which divide an applied voltage to obtain voltages each having a low resolution (a small number of bits), and then the analog outputs are added, thereby to obtain and output analog data. In such a manner, the digital-to-analog converter according to the embodiment is constituted by the digital-to-analog converters which divide a voltage to obtain voltages each having a low resolution (a small number of bits), and thus obtain a voltage having a high resolution (a large number of bits). In addition, it may be used as a digital-to-analog converter of serial comparison type.

In the above embodiment of the present invention, the analog output of the digital-to-analog converter for low order bits is attenuated by the attenuator, and then added to the analog output of the digital-to-analog converter for high order bits. However, the analog output of the digital-to-analog converter for high order bits may be increased by a booster, and then added to the analog output of the digital-to-analog converter for low order bits.

To summarize, in the embodiment, the analog output of the digital-to-analog converter for low order bits is attenuated by the attenuator, and then added to the analog output of the digital-to-analog converter for high order bits, as mentioned above. In addition, the attenuating ratio can be controlled by adjusting the resistance ratio or the capacitance ratio. Thus, the linearity of the analog output of the digital-to-analog converter can be improved even in the case where the converter is incorporated into an LSI or the like.

Moreover, the resistor string is used in common by the digital-to-analog converters for high order bits and for low order bits, thus reducing the number of resistors by the number of resistors doubling as ones for high order bits and ones for low order bits. As a result, the digital-to-analog converter can be formed to have a small size, and thus can be manufactured at a low cost.

In addition, the operating speed of the digital-to-analog converter can be increased since it is possible to easily decrease the output impedance of the resistor string doubling as the resistor strings of the digital-to-analog converters for high order bits and low order bits.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A digital-to-analog converter comprising:
    a first digital-to-analog converter for M bits, for converting M high order bits of input data of N bits without rendering any modification to an input digital quantity, and then outputting an analog output;
    a second digital-to-analog converter for (N-M) bits, for converting (N-M) low order bits of the input data of N bits without rendering any modification to the input digital quantity, and then outputting an analog output; and
    an analog operating circuit for adding the analog outputs of the first and second digital-to-analog converters, with a ratio of the former to the latter being substantially $2^M:1$, and outputting an analog signal representing a result of addition of the analog outputs.

2. The digital-to-analog converter according to claim 1, wherein at least one of the first and second digital-to-analog converters comprises:
    a decoder for decoding input digital data without rendering any modification to the input digital quantity;
    a voltage dividing circuit comprising unit resistors, which are series-connected to each other between a first reference voltage and a second reference voltage, for outputting divided voltages having a resolution determined in accordance with the number of bits of the input digital data; and
    switch circuits connected to voltage dividing output terminals of the voltage dividing circuit, respectively, each of the switch circuits being designed to select one of the divided voltages output from the voltage dividing circuit in accordance with output data of the decoder.

3. The digital-to-analog converter according to claim 2, wherein the voltage dividing circuit is used in common by the first and second digital-to-analog converters.

4. The digital-to-analog converter according to claim 1, wherein the analog operating circuit comprises a plurality of resistor elements for determining the ratio of $2^M$ to 1 and an operational amplifier for addition of the analog outputs.

5. The digital-to-analog converter according to claim 4, wherein:
    the analog operating circuit comprises (i) a first resistor element for feedback, which connects an output terminal of the operational amplifier and a negative input terminal thereof, (ii) second and third resistor elements connected in parallel with each other between the negative input terminal of the operational amplifier and a second reference voltage, (iii) a fourth resistor element connected to a positive input terminal of the operational amplifier, for receiving the analog output of the first digital-to-analog converter, (iv) a fifth resistor element connected to a positive input terminal of the operational amplifier, for receiving the analog output of the second digital-to-analog converter, and (v) a sixth resistor element connected between the positive input terminal of the operational amplifier and the second reference voltage; and the second, fourth and sixth resistor elements have substantially the same resistance, the third and fifth resistor elements have substantially the same resistance, and a resistance ratio of the resistance of the second, fourth and sixth resistor elements to the resistance of the third and fifth resistor elements are determined in accordance with the number of the M high order bits.

6. The digital-to-analog converter according to claim 5, which further comprises:

a first voltage follower amplifier provided at a front stage of the fourth resistor element, for receiving the analog output of the first digital-to-analog converter; and a second voltage follower amplifier provided at a front stage of the fifth resistor element, for receiving the analog output of the second digital-to-analog converter.

7. The digital-to-analog converter according to claim 4, wherein the analog operating circuit comprises (i) first and second voltage follower amplifiers for receiving the analog outputs of the first and second digital-to-analog converters, respectively, (ii) a third voltage follower amplifier for receiving a second reference voltage, (iii) a first resistor element for feedback, which connects an output terminal of the operational amplifier and a negative input terminal thereof, (iv) a second resistor element connected between the negative input terminal of the operational amplifier and one of ground potential and the second reference voltage, (v) a third resistor element connected between the negative input terminal of the operational amplifier and an output terminal of the third voltage follower amplifier, (vi) a fourth resistor element connected between a positive input terminal of the operational amplifier and an output terminal of the first voltage follower amplifier, (vii) a fifth resistor element between the positive input terminal of the operational amplifier and an output terminal of the second voltage follower amplifier, and (viii) a sixth resistor element connected between the positive input terminal of the operational amplifier and the output terminal of the third voltage follower amplifier; and the second, fourth and sixth resistor elements have substantially the same resistance, the third and fifth resistor elements have substantially the same resistance, and a resistance ratio of the resistance of the second, fourth and sixth resistor elements to the resistance of the third and fifth resistor elements are determined in accordance with the number of the M high order bits.

8. The digital-to-analog converter according to claim 1, wherein the analog operating circuit comprises a plurality of capacitor elements for determining the ratio of $2^M$ to 1 and an operational amplifier for addition of the analog outputs.

9. The digital-to-analog converter according to claim 8, wherein:

the analog operating circuit comprises (i) a first capacitor element for feedback, which connects an output terminal and a negative input terminal of the operational amplifier, (ii) a switch element connected in parallel with the first capacitor element, (iii) a second capacitor element connected between the negative input terminal of the operational amplifier and an analog output terminal of the first digital-to-analog converter; and (iv) a third capacitor element connected between the negative input terminal of the operational amplifier and an analog output terminal of the second digital-to-analog converter;

a positive input terminal of the operational amplifier is connected to ground potential; and a capacitance ratio of a capacitance of the second capacitor element to a capacitance of the third capacitor element is determined in accordance with the number of the M high order bits.

10. The digital-to-analog converter according to claim 9, wherein the first capacitor element has a capacitance determined in accordance with the sum of the capacitances of the second and third capacitor elements.

11. A digital-to-analog converter comprising:

a first digital-to-analog converter for M bits, for converting M high order bits of input data of N bits without rendering any modification to an input digital quantity, and then outputting an analog output;

a second digital-to-analog converter for (N-M) bits, for converting (N-M) low order bits of the input data of N bits without rendering any modification to the input digital quantity, and then outputting an analog output;

an attenuator for attenuating the analog output of the second digital-to-analog converter to substantially $1/2^M$; and an analog adder for adding the analog output of the first digital-to-analog converter to the attenuated analog output of the second digital-to-analog converter, and then outputting an analog signal representing a result of addition of the analog outputs.

12. The digital-to-analog converter according to claim 11, wherein at least one of the first and second digital-to-analog converters comprises:

a decoder for decoding input digital data without rendering any modification to the input digital quantity;

a voltage dividing circuit comprising unit resistors which are series-connected between a first reference voltage and a second reference voltage, for outputting divided voltages having a resolution determined in accordance with the number of bits of the input digital data; and switch circuits connected to voltage dividing output terminals of the voltage dividing circuit, respectively, each of the switch circuits being designed to select one of the divided voltages output from the voltage dividing circuit in accordance with the output data of the decoder.

13. The digital-to-analog converter according to claim 12, wherein the voltage dividing circuit is used in common by the first and second digital-to-analog converters.

14. The digital-to-analog converter according to claim 11, wherein the attenuator and the analog adder are constructed integrally and comprise a plurality of resistor elements and an operational amplifier for addition of the analog outputs.

15. The digital-to-analog converter according to claim 14, wherein:

the plurality of resistor elements comprise (i) a first resistor element for feedback, which connects an output terminal of the operational amplifier and a negative input terminal thereof, (ii) second and third resistor elements connected in parallel with each other between the negative input terminal of the operational amplifier and the second reference voltage, (iii) a fourth resistor element connected to a positive input terminal of the operational amplifier, for receiving the analog output of the first digital-to-analog converter, (iv) a fifth resistor element connected to the positive input terminal of the operational amplifier, for receiving the analog output of the second digital-to-analog converter, and (v) a sixth resistor element connected between the positive input terminal of the operational amplifier and the second reference voltage;

the second, fourth and sixth resistor elements have substantially the same resistance, and the third and fifth resistor elements have substantially the same resistance; and a resistance ratio of the resistance of the second, fourth and sixth resistor elements to the resistance of the third and fifth resistor elements are determined in accordance with the number of the M high order bits.

16. The digital-to-analog converter according to claim 15, which further comprises:

a first voltage follower amplifier provided at a front stage of the fourth element resistor, for receiving the analog output of the first digital-to-analog converter; and a second voltage follower amplifier provided at a front stage of the fifth resistor element, for receiving the analog output of the second digital-to-analog converter.

17. The digital-to-analog converter according to claim 14, which further comprises (i) first and second voltage follower amplifiers for receiving the analog outputs of the first and second digital-to-analog converters, respectively, and (ii) a third voltage follower amplifier for receiving a second reference voltage, and wherein:

the plurality of resistor elements comprise (i) a first resistor element for feedback, which connects an output terminal of the operational amplifier and a negative input terminal thereof, (ii) a second resistor element connected between the negative input terminal of the operational amplifier and one of ground potential and the second reference voltage, (iii) a third resistor element connected between the negative input terminal of the operational amplifier and an output terminal of the third voltage follower amplifier, (iv) a fourth resistor element connected between a positive input terminal of the operational amplifier and the output terminal of the first voltage follower amplifier, (v) a fifth resistor element connected between the positive input terminal of the operational amplifier and an output terminal of the second voltage follower amplifier, and (vi) a sixth resistor element connected between the positive input terminal of the operational amplifier and an output terminal of the third voltage follower amplifier; and the second, fourth and sixth resistor elements have substantially the same resistance, the third and fifth resistor elements have substantially the same resistance, and a resistance ratio of the resistance of the second, fourth and sixth resistor elements to the resistance of the third and fifth resistor elements are determined in accordance with the number of the M high order bits, so as to determine $1/2^M$ of an amount of attenuation of the attenuator.

18. The digital-to-analog converter according to claim 11, wherein the attenuator and the analog adder are constructed integrally and comprise a plurality of capacitor elements and an operational amplifier for addition of the analog outputs.

19. The digital-to-analog converter according to claim 18, which further comprises a switch element connected between an output terminal of the operational amplifier and a negative input terminal thereof, and wherein:

the plurality of capacitor elements comprise (i) a first capacitor element for feedback, which connects the output terminal of the operational amplifier and the negative input terminal thereof, (ii) a second capacitor element connected between the negative input terminal of the operational amplifier and an analog output terminal of the first digital-to-analog converter, and (iii) a third capacitor element connected between the negative input terminal of the operational amplifier and an analog output terminal of the second digital-to-analog converter; and a positive input terminal of the operational amplifier is connected to ground potential, and a capacitance ratio of a capacitance of the second capacitor element to a capacitance of the third capacitor element is determined in accordance with the number of the M high order bits, so as to determine $1/2^M$ of an amount of attenuation of the attenuator.

20. The digital-to-analog converter according to claim 19, wherein the first capacitor element has a capacitance determined in accordance with the sum of the capacitances of the second and third capacitor elements.

\* \* \* \* \*